United States Patent
Gao et al.

(10) Patent No.: US 6,801,046 B1
(45) Date of Patent: Oct. 5, 2004

(54) METHOD OF TESTING THE ELECTROSTATIC DISCHARGE PERFORMANCE OF AN IC DEVICE

(75) Inventors: Gengying Gao, Fremont, CA (US); Mohan Yegnashankaran, Redwood City, CA (US); Hengyang (James) Lin, San Jose, CA (US); Kevin Weaver, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 259 days.

(21) Appl. No.: 09/670,154

(22) Filed: Sep. 26, 2000

(51) Int. Cl.[7] .......................................... G01R 31/302
(52) U.S. Cl. ...................................... 324/752; 324/751
(58) Field of Search ................................ 324/752, 770, 324/158.1, 763, 71.3, 97, 751, 754, 755, 765; 345/87, 904; 348/129; 250/310; 156/630

(56) References Cited

U.S. PATENT DOCUMENTS

| 4,829,243 | A | * | 5/1989 | Woodard | 324/751 |
| 5,432,461 | A | * | 7/1995 | Henley | 324/770 |
| 5,872,360 | A | | 2/1999 | Paniccia et al. | |
| 5,982,190 | A | * | 11/1999 | Toro-Lira | 324/501 |
| 6,020,746 | A | * | 2/2000 | Livengood | 324/754 |

* cited by examiner

Primary Examiner—David A. Zarneke
Assistant Examiner—Trung Q. Nguyen
(74) Attorney, Agent, or Firm—Jurgen Vollrath

(57) ABSTRACT

A method for non-destructively testing an IC device to determine the ESD performance. A laser beam is used to probe the diffusions of the device. The amount of light absorbed by the diffusions is determined by monitoring the degree to which light is reflected by the device. The amount of reflection is related to the ESD susceptibility of the device in that the greater the amount of reflection, the worse the ESD performance of the device.

20 Claims, 3 Drawing Sheets

METHOD OF TESTING THE ELECTROSTATIC DISCHARGE PERFORMANCE OF AN IC DEVICE

BACKGROUND OF THE INVENTION

1. Field of the Invention

The invention relates to a method of testing the susceptibility of electric circuits to electrostatic discharge (ESD). In particular it relates to the non-destructive testing of an IC device to determine the ESD performance.

2. Discussion of the Prior Art

The circuits of integrated circuit devices (IC's) are invariably exposed to electrostatic discharge (ESD) through handling, typically during manufacture and installation of the component. It is therefore desirable to manufacture such circuits to have a certain resilience to ESD and to be able to make a determination as to the reliability of such IC devices. Various approaches have been adopted in the past to test the ESD performance of IC devices. These include such tests as the human body model (HBM), the machine model (MM), and the charged device model (CDM). All of these tests, as known in the art, are destructive in nature. Thus, the device is damaged to some extent by the testing process. These tests involve discharging a charge into the various pins, and subsequently testing the part, e.g., using automatic testing equipment (ATE).

The present invention seeks to address these problems.

SUMMARY OF THE INVENTION

According to the invention there is provided a non-destructive method of testing the ESD performance of an IC device, comprising probing the device with a laser beam, and monitoring the amount of light reflected from the device.

Typically, an infrared laser beam is used to probe the IC device, and preferably the energy of the laser beam corresponds substantially to the bandgap of the substrate of the device. In the case of silicon substrate integrated circuits, the energy of the laser preferably is about 1.1 eV.

The diffusions of the device are probed, and are typically probed through the back of the device. Typically, an I/O cell is probed to determine how much light is absorbed and how much light is reflected by the diffusion, and preferably, several samples are taken of each probed location, and the results averaged. A pulsed laser, also known as a mode-locked laser (ML) is used to probe the IC device. Typically, however, a continuous wave laser is used in addition to the mode-locked laser, to provide an image of the IC device in order to facilitate the positioning of the mode-locked laser beam.

Testing may be performed on the device in its final packaged state or prior to packaging, and even prior to completion of all of the layers of the device. For purposes of this application, the term device includes pre-packaged devices and devices that include only some of the layers of the final IC device.

The testing is typically performed with power supplied to the device, and the laser beam may be positioned manually by a user, or automatically, using image recognition technology.

DETAILED DESCRIPTION OF THE INVENTION

Diffusions in the form of device structures such as gates, and N-channel and P-channel diffusions in an IC device are susceptible to ESD damage. This susceptibility may vary depending on the nature of the diffusions, i.e., the dimensions of the diffusion and the nature and extent of the impurities constituting the dopant, as well as the interrelationship of the various layers of the IC device, and the routing of the metalization.

Figure 1:
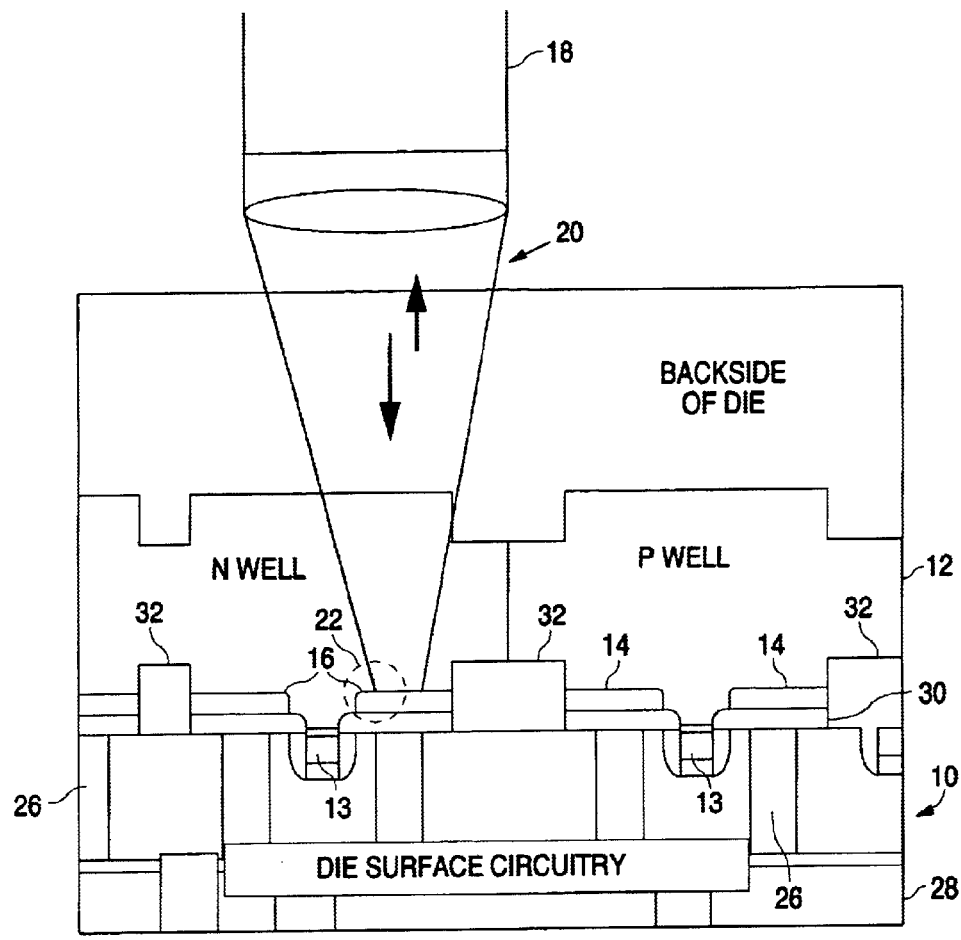
FIG. 1 is a cross-section through an IC device showing a schematic representation of an infrared beam probe.

A cross-section of a typical integrated circuit is shown in FIG. 1. The IC device 10 includes a silicon substrate 12 into which diffusions in the form of gates 13, N-channels 14 and P-channels 16 have been formed by doping the silicon with impurities. The device 10 is shown upside down with a laser probe 18 directing a laser beam 20 through the substrate at various portions of the device 10. The laser beam 20 is shown probing one of the P-channels in FIG. 1. It has been found that good results are obtained by probing a diffusion region in a region as depicted by reference numeral 22. Tungsten plugs 26 provide a connection between the metal layer 28 and the diffusions 13, 14, 16. Silicide 30' is provided between the diffusions 14, 16 and the tungsten plugs 26. SiO2 isolation regions 32 are provided between the gates.

It will be appreciated that the number and nature of the layers of an IC device may vary from one device to the next. Integrated circuit devices typically include numerous layers, making it difficult to probe a device from the top, in order to access the gates and the N- and P-channels. Ideally, therefore, the device is probed through the back as illustrated in FIG. 1. As mentioned above, the invention makes use of a light source, in this case, an infrared (IR) laser to probe the IC device.

The inventors have found that the degree to which a circuit element such as the ESD input protection circuitry is susceptible to ESD damage, is related to the ability of the element to absorb light. It has been found that the greater the extent to which a diffusion will reflect light, the greater the susceptibility of the element to ESD damage. The invention, therefore, includes the process of probing IC devices with a laser beam. The wavelength of the laser beam is ideally related to the bandgap energy of the substrate material. In the case of silicon, having a bandgap of 1.1 eV, a light beam of 1.1 or below is typically used. Typically the energy level of the light is kept below 1.1 eV to avoid absorption by the silicon substance (fundamental absorption) above 1.1 eV. The silicon appears transparent to light energy levels below 1.1 eV, thus allowing the light to penetrate the silicon substrate and probe the diffusions of the IC device. However, to avoid scattering of the light as the energy level decreases, the energy level of the light is typically kept close to 1.1 eV.

Since energy is related to frequency by the equation $\lambda = E/hc$ where $\lambda$ is wavelength, E is energy, h is Plank constant ($h = 6.626 \times 10^{-34}$) and c is the speed of light ($c = 3 \times 10^8$ m/s), the ideal wavelength can be determined. For silicon, the wavelength of the laser therefore will be approximately 1064 nm.

Figure 2:
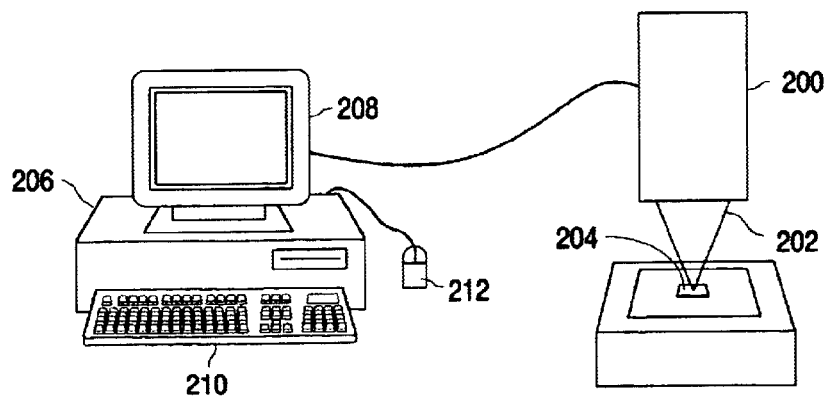
FIG. 2 is a schematic representation of an infrared laser system connected to a computer system and arranged to scan an IC device.

Light reflected back from the IC device is captured by laser scanning microscope, such as the mode-locked LSM 1064B by Checkpoint. The laser scanning microscope includes a fiber optic channel that transmits the reflected light to a detector which is connected to a computer system having a graphic user interface as shown in FIG. 2.

The laser equipment 200 directs a laser beam 202 onto an IC device 204. The equipment 200 is connected to a computer system that includes a computer 206 having a display screen 208, a keyboard 210, and a typical user interface device such as a mouse 212. The laser beam 202 takes the form of a pulsed laser beam. This is also referred to as a mode-locked laser such as the Model 131 by Light Wave. A pulse every 10 ns, each pulse being 35 ps in length, has been found to work well. Typically, a number of pulses, e.g., 100 pulses, are sampled and averaged. Thus the number of photons reflected by the diffusion of the probed circuit can be measured and the results graphically represented on the display monitor 208.

Figure 3:
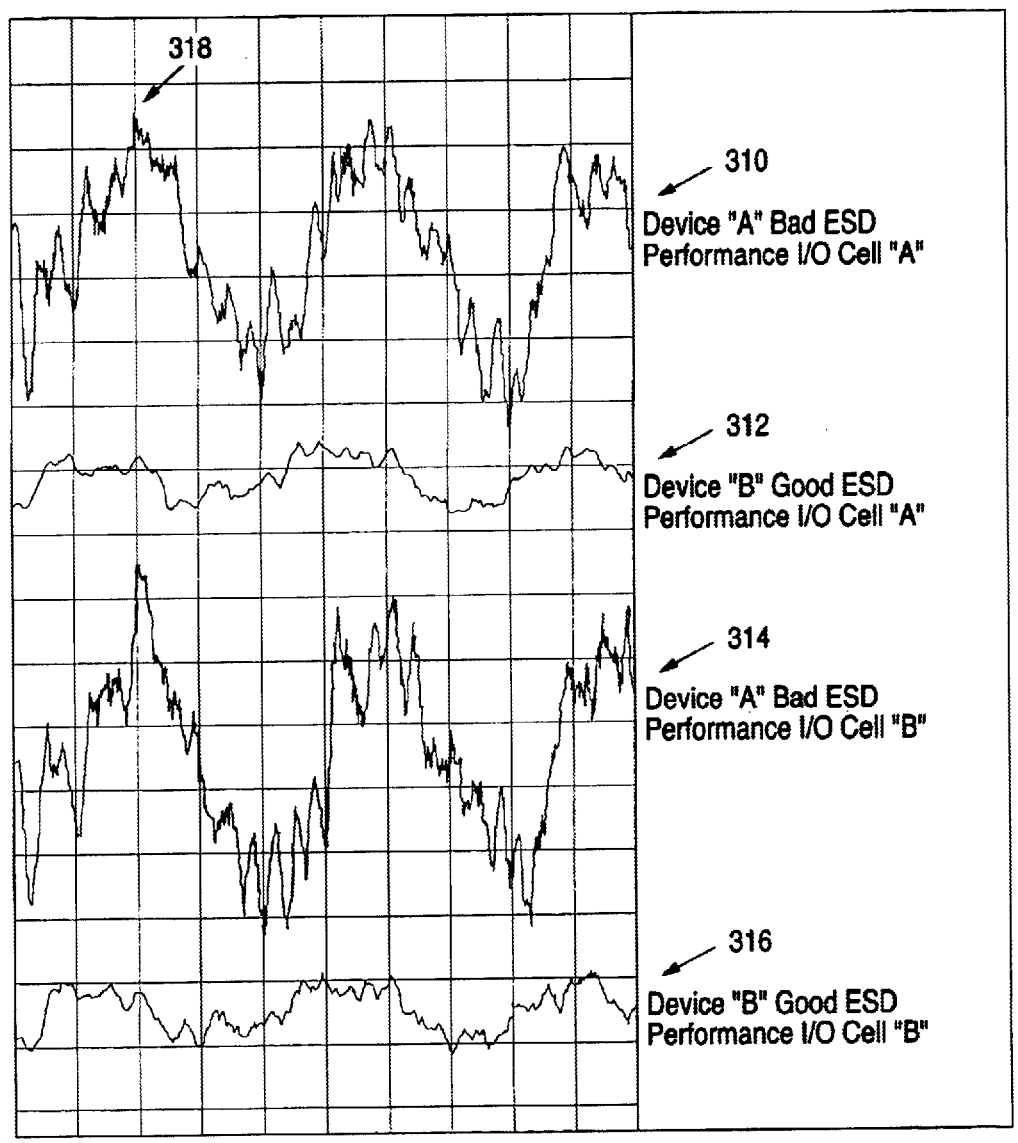
FIG. 3 is a set of graphs showing the relative amount of reflected light emitted from some probed IC devices; and, FIG. 4 is an image of part of an IC device.

A typical set of waveforms, showing the optoelectric samplings for two devices probed at two I/O cells is shown in FIG. 3. In this example, a signal of about 50 MHz varying between 0 and 3 V is applied to the input pins of the device. Graph 310 shows the waveform for the relative amount of reflected light that is emitted from a device that displays bad ESD performance when one of the I/O cells is probed. Time is indicated along the horizontal axis, each division representing 10 ns. The fluctuations in the waveform correspond to the varying power conditions of the input signal to the I/O. By sampling the relative amount of reflection, say 100 times, at the same I/O signal voltage level, which corresponds to repeated similar positions along the input signal waveform, a reading such as the peak 318 is obtained. Other peaks and troughs of a particular waveform in FIG. 3 are derived from further samplings of a particular I/O, and represent the varying light reflections as the voltage of the input signal to the I/O changes. The vertical axis represents the relative amount of reflection from the diffusion of the I/O cell, expressed as a ratio, each division representing 500 ppm. Thus, it shows the relative number of photons that are reflected as compared to the photons directed at the IC device. In contrast, graph 312 shows the waveform for an I/O cell of a device having good ESD performance. It will be noted that the amplitude of the waveform 312 is significantly lower than the waveform depicted by graph 310. Thus, there is a direct relationship between the ESD performance and the amplitude of the waveform, namely the number of reflections decreases in the case of an I/O cell showing good ESD performance since the diffusion of such a cell will absorb most of the light directed at it. Graph 314 shows a relative amount of the reflection from the second I/O cell of a device having poor ESD performance. Graph 316, in turn, shows the relative amount of reflection from the second cell of a device showing good ESD performance.

It should be noted that, in this embodiment, the probing of the IC devices takes place when power is supplied to the device, since the bandgap of the silicon will change when power is supplied to the device. It will be appreciated that similar testing could be performed without applying power to the device, by using light energy that takes into account the bandgap in the absence of power supplied to the circuit.

Figure 4:
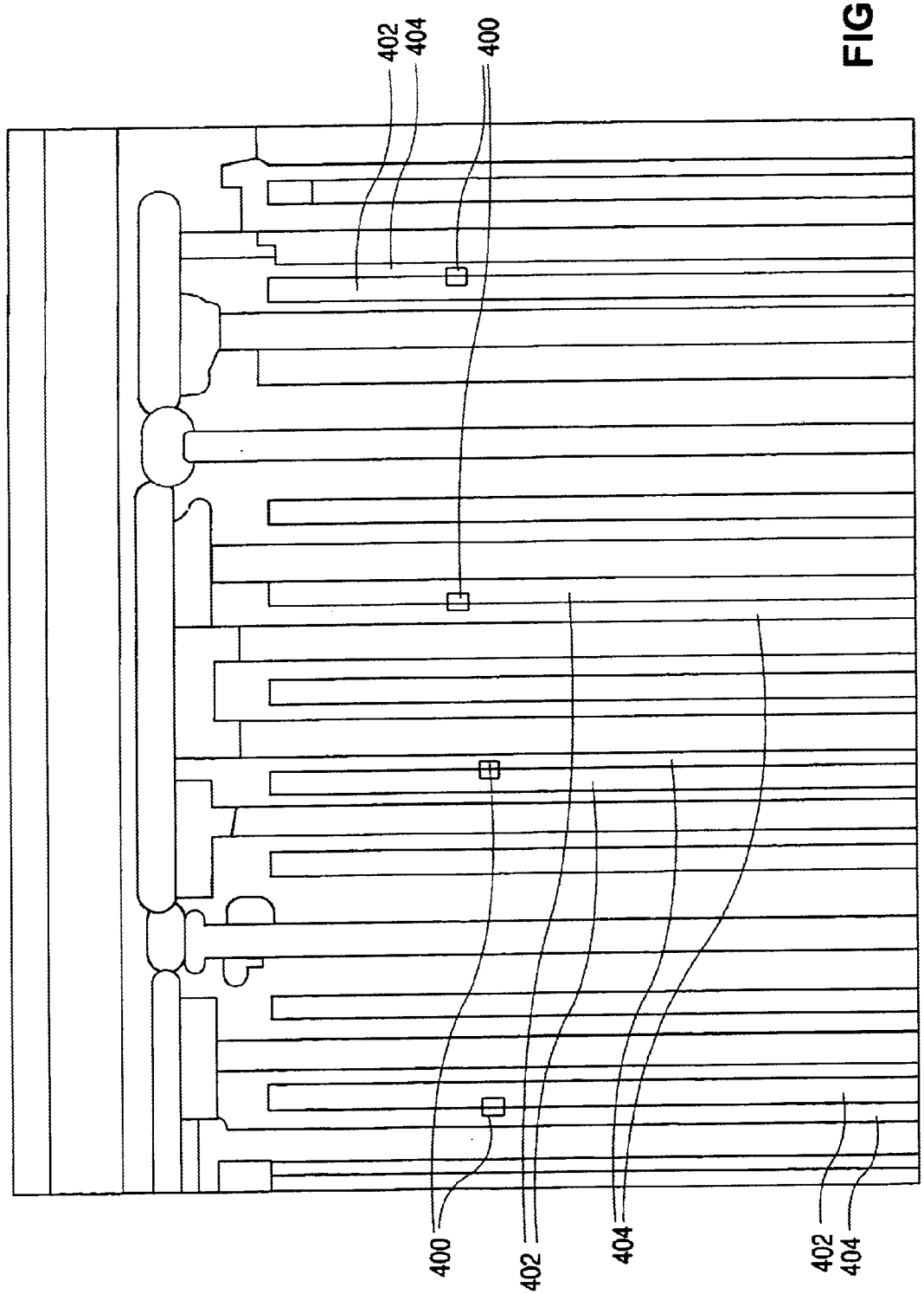

As has been mentioned above, it has been found that probing the areas indicated by reference numeral 22 in FIG. 1, provides a good indication of the ESD susceptibility of a device. These regions are indicated in FIG. 4 by reference numeral 400. The dark regions 402 spanned by the regions 400 comprise the diffusions and can be either N- or P-channels. The light regions 404 spanned by the regions 400 constitute the tungsten plugs.

Probing the ESD input protection circuitry of a CMOS or mixed signal IC device has been found to be easily achievable due to the large physical dimensions of these elements. The to laser beam converges as illustrated in FIG. 1, and its width, at the probe distance, i.e., the spot size, is typically 0.7–0.8 μm. A laser beam with a spot size of 0.7–0.8 μm is capable of probing the circuit elements with physical dimensions of approximately 0.18 μm. An IC device may have a number of I/O's, e.g., 2–4, each having several gates, e.g., 10 gates. Typically, only one gate per I/O need be probed in order to provide information about the ESD susceptibility of the I/O.

To facilitate probing of an IC device, an image as shown in FIG. 4 is preferably obtained using a continuous wave (CW) laser such as a compass 1064-50 Nd:YAG pumped laser by Coherent. This allows the probe to be correctly positioned. The CW laser is typically a low-intensity laser in the 3–5 mW range. By comparison, the pulsed laser, or mode-locked laser used in the invention to probe the device, typically is of a higher power, namely 9–15 mW.

In the embodiment described above, a human user positions the laser probe. The user is provided with a graphical user interface on the display screen 208 of his computer 206. This allows the user to position the laser probe using an input device such as the mouse 212 which, in turn, relays the positional information to the laser probe.

It will be appreciated that the positioning of the laser probe may, instead, be automated by making use of character recognition technology to recognize the critical features of a circuit of an integrated circuit device and coupling the character recognition circuitry to the laser probe to correctly position the probe.

In the situation where the IC device is probed under conditions where power is supplied to the device, such testing can be done to the final, packaged device. However, electrical contacts may, instead, be applied to a pre-packaged device to facilitate the ESD testing prior to packaging. It will be appreciated that ESD testing according to the invention may even be performed prior to all layers of the device having been deposited. This allows early ESD problems to be detected to avoid unnecessary manufacturing costs. For example, ESD testing could be performed once the first metal layer has been deposited, much in the same way as E-testing is performed. It will also be appreciated that contacts could be established for purposes of applying power to the device even prior to depositions of the first metalization layer by using a focused ion beam. It will be appreciated that ESD testing according to the invention may be performed prior to all layers of the device having been deposited. This allows early ESD problems to be detected to avoid unnecessary manufacturing costs. While specific embodiments of the invention were discussed above, if will be appreciated that the particular implementation may vary without departing from the scope of the invention.

What is claimed is:

1. A method of testing the ESD performance of an IC device, comprising probing the device with a laser beam, monitoring the amount of light reflected from the device, and comparing the amount of light reflected to the amount of light reflected from an I/O cell having good performance.

2. A method of claim 1, wherein a laser beam is used to probe the IC device.

3. A method of claim 2, wherein the energy of the laser beam corresponds substantially to the bandgap of the substrate of the device.

4. A method of claim 3, wherein the substrate is silicon and the energy of the laser beam is about 1.1 eV.

5. A method of claim 3, wherein the diffusions of the IC device are probed with the laser beam.

6. A method of claim 5, wherein the device is probed through the back of the device.

7. A method of claim 6, wherein the diffusions of I/O cells are probed to determine how much light is absorbed and how much light is reflected by the diffusions.

8. A method of claim 6, wherein a mode-locked laser is used to probe the IC device.

9. A method of claim 8, wherein a continuous wave laser is used in addition to the mode-locked laser, to provide an image of the IC device in order to facilitate the positioning of the beam of the mode-locked laser.

10. A method of claim 8, wherein the mode-locked laser is positioned by a user.

11. A method of claim 8, wherein the mode-locked laser is positioned automatically using image recognition.

12. A method of claim 5, wherein several samples are taken of each probed location, at the I/O signal voltage level, and the results averaged.

13. A method of claim 5, wherein power is supplied to the device during testing.

14. A method of claim 13, wherein testing is performed on the device in a packaged form.

15. A method of claim 13, wherein testing is performed on the device in a prepackaged form.

16. A method of claim 15, wherein the device includes only some of its layers.

17. A method of claim 1, wherein a mode-locked laser is used to probe the IC device.

18. A method of claim 17, wherein a continuous wave laser is used in addition to the mode-locked laser, to provide an image of the IC device in order to facilitate the positioning of the beam of the mode-locked laser.

19. A method of claim 17, wherein the mode-locked laser is positioned by a user.

20. A method of claim 17, wherein the mode-locked laser is positioned automatically using image recognition.

* * * * *